(12) United States Patent
Keehn et al.

(10) Patent No.: US 12,356,594 B2
(45) Date of Patent: Jul. 8, 2025

(54) SELF-CONTAINED IMMERSION COOLING SERVER ASSEMBLIES

(71) Applicant: Microsoft Technology Licensing, LLC, Redmond, WA (US)

(72) Inventors: Nicholas Keehn, Kirkland, WA (US); Robert Jason Lankston, Woodinville, WA (US); Husam Alissa, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 263 days.

(21) Appl. No.: 17/944,461

(22) Filed: Sep. 14, 2022

(65) Prior Publication Data

US 2023/0015461 A1    Jan. 19, 2023

Related U.S. Application Data

(63) Continuation of application No. 17/149,528, filed on Jan. 14, 2021, now Pat. No. 11,483,949, which is a continuation of application No. 16/679,752, filed on Nov. 11, 2019, now Pat. No. 10,925,188.

(51) Int. Cl.
*H05K 7/20*       (2006.01)
*B08B 9/032*      (2006.01)

(52) U.S. Cl.
CPC ....... *H05K 7/20809* (2013.01); *B08B 9/0321* (2013.01); *H05K 7/203* (2013.01); *H05K 7/20318* (2013.01); *H05K 7/20754* (2013.01); *H05K 7/20836* (2013.01)

(58) Field of Classification Search
CPC ............... H05K 7/20809; H05K 7/203; H05K 7/20318; H05K 7/20754; H05K 7/20836; B08B 9/0321
See application file for complete search history.

(56) References Cited

U.S. PATENT DOCUMENTS

| 9,622,394 B1 * | 4/2017 | Frank ................. H05K 7/20136 |
| 2017/0013744 A1 * | 1/2017 | Shelnutt ................. H05K 7/203 |
| 2017/0105313 A1 * | 4/2017 | Shedd ................ H05K 7/20309 |

(Continued)

OTHER PUBLICATIONS

Communication pursuant to Article 71(3) EPC, Received for European Application No. 20817574.5, mailed on Jun. 25, 2024, 9 pages.

(Continued)

*Primary Examiner* — Henry T Crenshaw
*Assistant Examiner* — Kamran Tavakoldavani
(74) *Attorney, Agent, or Firm* — RAY QUINNEY & NEBEKER P.C.; Paul N. Taylor

(57) ABSTRACT

Self-contained server assemblies for housing servers or server blades and associated computing facilities are disclosed herein. In one embodiment, a server assembly includes an enclosure having an interior space housing a server blade, a dielectric coolant submerging heat producing components of the server blade, and a condenser assembly having a condenser coil in fluid communication with a vapor gap in the interior space. The condenser coil is configured to receive a coolant that removes heat from a vapor of the dielectric coolant in the vapor gap, thereby condensing the vapor into a liquid form to be returned to the server blade.

20 Claims, 5 Drawing Sheets

(56) References Cited

U.S. PATENT DOCUMENTS

2018/0335821 A1* 11/2018 Kamiya ................ G03G 15/55

OTHER PUBLICATIONS

Communication under Rule 71(3) received in European Application No. 20817574.5, mailed on Nov. 21, 2024, 09 pages.
Decision to grant a European patent pursuant to Article 97(1) received in European Application No. 20817574.5, mailed on Mar. 27, 2025, 02 pages.

* cited by examiner

SELF-CONTAINED IMMERSION COOLING SERVER ASSEMBLIES

CROSS-REFERENCE TO RELATED APPLICATION(S)

This application is a continuation of U.S. patent application Ser. No. 17/149,528, filed Jan. 14, 2021, which is a continuation of and claims priority to U.S. patent application Ser. No. 16/679,752, filed on Nov. 11, 2019, now U.S. Pat. No. 10,925,188, which are hereby incorporated by reference in their entireties.

BACKGROUND

Large computing facilities such as datacenters typically include a distributed computing system housed in large buildings, containers, or other suitable enclosures. The distributed computing system can contain thousands and even millions of servers interconnected by routers, switches, bridges, or other types of network devices. The individual servers can host one or more virtual machines or containers. The virtual machines or containers can execute applications to provide cloud or other suitable types of computing services to users.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Servers in datacenters typically include one or more central processing units ("CPUs"), graphic processing units ("GPUs"), solid state drivers ("SSDs"), memory chips, or other suitable types of hardware components mounted on a printed circuit board as a "server blade." CPUs, GPUs, and other hardware components of a server blade can produce heat during operation. If not adequately dissipated, the produced heat can damage, degrade, or otherwise negatively impact performance of the various components on the server blade.

Various air-cooling techniques have been used to dissipate heat produced by hardware components of servers. For example, one technique includes placing a fan in a server enclosure (e.g., top or bottom of a cabinet) to draw cooling air from outside of the server enclosure into contact with heat producing components inside the server enclosure. The cooling air can then carry away the produced heat to outside of the server enclosure. In another example, intercoolers (e.g., cooling coils) can be positioned between sections of the server enclosure. The intercoolers can remove heat from sections of the servers in the server enclosure to a cooling fluid (e.g., chilled water) and generally maintain the cooling air at a certain temperature range inside the server enclosure.

The foregoing air cooling techniques, however, have certain drawbacks. First, air cooling can be thermodynamically inefficient when compared to liquid cooling. As a heat transfer medium, air has heat transfer coefficients that is an order of magnitude below water, ethylene glycol, or other suitable types of liquid. As such, due to limitation on heat removal, densities of heat producing components on a server blade can be limited. In addition, air cooling can have long lag times in response to a control adjustment or load change. For example, when a temperature in a server enclosure exceeds a threshold, a fan can be activated to introduce additional flow of cooling air into the server enclosure to reduce the temperature. However, due to low heat transfer rates of cooling air, the temperature in the server enclosure may stay above the threshold for a long period even with the additional flow of cooling air.

Immersion cooling can address at least some of the foregoing drawbacks of air cooling. Immersion cooling generally refers to a cooling technique of placing heat producing components such as CPUs, GPUs, SSDs, memory, and/or other hardware components on a server blade submerged in a thermally conductive but dielectric liquid (referred to herein as a "dielectric coolant"). Example dielectric coolants can include mineral-oils or synthetic chemicals. Such dielectric coolants can have dielectric constants similar to that of ambient air. For example, a dielectric coolant provided by 3M (Electronic Liquid FC-3284) has a dielectric constant of 1.86 while that of ambient air at 25° C. is about 1.0.

During operation, a dielectric coolant can remove heat from heat producing components on a server blade via evaporation, and thus forming a two-phase fluid in a server enclosure. Vapor of the dielectric coolant (referred to herein as "dielectric vapor") can then be cooled and condensed via a coolant circulation system to remove heat from the dielectric vapor. The dielectric coolant can have much higher heat transfer coefficients than cooling air, and thus enabling much higher densities of heat producing components on a server blade. Higher densities of hardware components can result in smaller footprint for datacenters, racks, server enclosures, or other suitable types of computing facilities. The dielectric coolant can also allow fast cooldown of hardware components in the server enclosure due to control adjustment or load change. As such, long delays to lower temperatures in a server enclosure may be avoided.

One example design of an immersion cooling enclosure includes an elongated container (e.g., a 10-foot long container commonly referred to as a "tank" or "immersion cooling tank") housing multiple server blades mounted vertically in the tank. Such a design has several drawbacks. First, retrofitting existing datacenters to accommodate such immersion cooling tanks may be costly. In existing datacenters, support structures holding server blades are typically much too small to accommodate 10-foot immersion cooling tanks. As such, installing immersion cooling tanks may require additional and different support structures, such as concrete pad or pits.

To provide such support structures for immersion cooling tanks, however, can incur significant costs and prone to human error. For example, to accommodate an immersion cooling tank, a concrete pad may be erected in a datacenter. Accessory components such as power distribution panels, leak detectors, and cable termination panels may be installed around the concrete pad. The immersion cooling tank can then be installed on the prepared concrete pad, connected to power/signal lines, and server blades can then be installed in the tank. Once installed, a technician can charge the tank with a dielectric coolant, seal the tank, and ready the server blades for operation. As such, the installation of the tank involves multiple different operations that are performed in a prescribed sequence. The complexity of the multiple operations can thus incur high costs of installation and prone to human error.

In addition, the tank design for immersion cooling can incur high operating costs due to significant loss of the dielectric coolant due to leakage, pressure control, maintenance, or other reasons. For example, pressure inside the tank may exceed a threshold during operation. To reduce the pressure, a portion of the dielectric vapor may be purged from the tank. In another example, when one of the server blades in the tank fails or require maintenance, a technician may need to open the tank housing all of the server blades to replace the failed server blade, and thus causing excess loss of the dielectric coolant. In addition, current datacenters can have relatively high air velocity due to utilization of air cooling. The high air velocity can further exacerbate the loss of the dielectric coolant due to leakage, pressure control, maintenance, or other reasons.

Several embodiments of the disclosed technology can address at least some of the drawbacks of immersion cooling tanks by implementing a self-contained server assembly with an immersion cooling enclosure sized and shaped to fit into a rack, drawer, cabinet, or other suitable types of air-cooling support structure. In one embodiment, the immersion cooling enclosure can be configured to accommodate a single server blade. In another embodiment, the immersion cooling enclosure can be configured to accommodate two or more server blades juxtaposed or in other suitable arrangement related to one another.

In certain implementations, the immersion cooling enclosure can include a polyhedron or cuboid shape having a top wall, a bottom wall, and sidewalls between the top and bottom walls around an interior space. The sidewalls of the immersion cooling enclosure can have a height, width, and/or depth selected to fit into existing rack, drawer, or other suitable types of support structures. In other implementations, the immersion cooling enclosure can also have trapezohedron or other suitable shapes.

In one embodiment, a server blade can be mounted on a portion of the bottom wall in the interior space of the immersion cooling enclosure. The server blade can include a printed circuit board ("PCB") carrying one or more CPUs, GPUs, SSDs, memory chips, or other suitable types of hardware components. The PCB and the hardware components carried on the PCB can be submerged in a dielectric coolant inside the immersion cooling enclosure. The PCB of the server blade can be oriented generally perpendicular to gravity when installed into an existing rack, drawer, or other suitable types of support structures. A distance between the top wall and the bottom wall (referred to as "spacing") can be just sufficient to accommodate a height of the PCB and other components carried thereon. For example, the spacing can be about 105% of a largest height of the components on the PCB extending from the bottom wall toward the top wall. In other examples, the spacing can be 110%, 115%, 120%, or other suitable values not exceeding 150%, 200%, or 250%.

The self-contained server assembly can also include a condenser assembly inside the immersion cooling enclosure and proximate to the PCB. In one example, the condenser assembly can include a vapor inlet and a liquid outlet at a first end proximate the PCB and a coolant inlet and a coolant outlet at a second end opposite the first end. The condenser assembly can also include a condenser coil at least partially extending between the first end and the second end. During operation, hardware components on the PCB can produce heat. The dielectric coolant submerging the PCB can absorb the produced heat and at least partially evaporate as a dielectric vapor. The condenser assembly can then draw the dielectric vapor through the vapor inlet and toward the cooling coil via a fan, natural convection, diffusion, or other suitable mechanisms. The coolant (e.g., cooling water or chilled water) passing through the cooling coil can then remove heat from the dielectric vapor and condense the dielectric vapor back into a liquid form. The condensed dielectric coolant can then be returned to the PCB through the liquid outlet via gravity, a pump, or other suitable means. As such, the condenser assembly can facilitate operation of various hardware components on the PCB by removing heat from the hardware components to the circulating coolant.

In certain implementation, the self-contained server assembly can also include an air passage above the top wall and a coolant supply assembly in fluid communication with a cooling air via the air passage. In one embodiment, the air passage can include an air duct above the top wall with a cooling air inlet configured to receive cooling air and a cooling air outlet configured to exhaust the cooling air to outside of the immersion cooling enclosure. In another embodiment, the air passage includes an opening on a portion of the top wall above the coolant supply assembly instead of the air duct. The opening is configured to receive the cooling air passing above the immersion cooling enclosure and provide the received cooling air to the coolant supply assembly. In further embodiments, the air passage may be omitted, and a coolant supply assembly can be configured to provide the coolant to multiple self-contained server assemblies. In such embodiments, the coolant inlet and coolant outlet of the self-contained server assembly may be configured to be coupled to corresponding connectors on a coolant manifold via compression fitting, friction fitting or other suitable fitting techniques.

In certain implementations, the coolant supply assembly can include a circulating pump, a reservoir, a heat exchanger, and an air mover proximate the second end of the condenser assembly. The reservoir can include a container that is configured to store a suitable amount of the coolant (e.g., cooling water). The circulating pump can include a screw pump, a diaphragm pump, or other suitable types of pump configured to circulate the coolant from the reservoir to the cooling coil of the condenser assembly. In one embodiment, the heat exchanger can be configured to transfer heat from the coolant to the cooling air received via the air passage. As such, a temperature of the coolant may be reduced while the heated cooling air may be exhausted to outside of the immersion cooling enclosure via the air mover, natural convection, or other suitable mechanisms. In other embodiments, the heat exchanger can be configured to transfer heat from the coolant to chilled water, cooling water, or other suitable heat transfer media.

In certain embodiments, the self-contained server assembly can also include a dielectric coolant supply assembly having a reservoir pre-charged with a suitable amount of the dielectric coolant. During installation, upon installing the immersion cooling enclosure into a support structure, a valve between the dielectric coolant reservoir and the PCB can be actuated to allow a target amount of the pre-charged dielectric coolant to be released onto the PCB to submerge various hardware components on the PCB. As such, complex operations to charge the dielectric coolant during installation may be eliminated. In some embodiments, the self-contained server assembly can also include a level sensor (e.g., a float) that is configured to measure and control a fluid level of the dielectric coolant on the PCB. When the level sensor detects a level below a threshold, the level sensor and/or other suitable control elements may actuate the valve to introduce additional dielectric coolant onto the PCB. Thus, a target level of the dielectric coolant may be maintained in the immersion cooling enclosure. In other embodiments, the level sensor may be omitted, and the dielectric coolant may be metered onto the PCB at a preset rate.

In additional embodiments, the self-contained server assembly can further include an inert gas assembly having a gas reservoir that is configured to contain nitrogen, argon, or other suitable types of inert gas and a pressure controller configured to maintain a suitable pressure level inside the immersion cooling enclosure. During operation, the pressure controller can monitor a pressure level inside the immersion cooling enclosure. When the pressure controller detects a pressure level below a threshold, the pressure controller can be configured to introduce additional inert gas from the gas reservoir into the immersion cooling enclosure. As such, the immersion cooling enclosure can be pressurized with the inert gas in order to reduce a rate of loss of the dielectric vapor. In further embodiments, the self-contained server assembly can also include a membrane around at least a portion of the internal space of the immersion cooling enclosure. The membrane can be configured to allow air and/or the inert gas to pass through but not the dielectric vapor, and thus facilitating reduction of loss of the dielectric coolant from the immersion cooling enclosure.

Several embodiments of the disclosed technology can enable fast deployment of immersion cooled servers in existing datacenters. For example, by including the condenser assembly, the dielectric coolant supply assembly, and optionally the inert gas assembly in a single immersion cooling enclosure, complex field operations such as purging and/or charging the dielectric coolant can be avoided. The immersion cooling enclosure can also allow hybrid cooling solutions by incorporating a self-contained server assembly into a support structure with air-cooled enclosures. Also, pressure control, fluid expansion, and dielectric coolant condensing can all be server-level serviceable, and thus reducing large scale downtime. In contrast, when one server blade fails in an immersion cooling tank, other server blades may be shut down before the failed server blade can be serviced. In addition, the self-contained server assembly can be configured to contain a small volume of the dielectric coolant. As such, risks of excessive pressure buildup can be at least reduced when compared to larger and deeper immersion cooling tanks.

DETAILED DESCRIPTION

Figure 1:
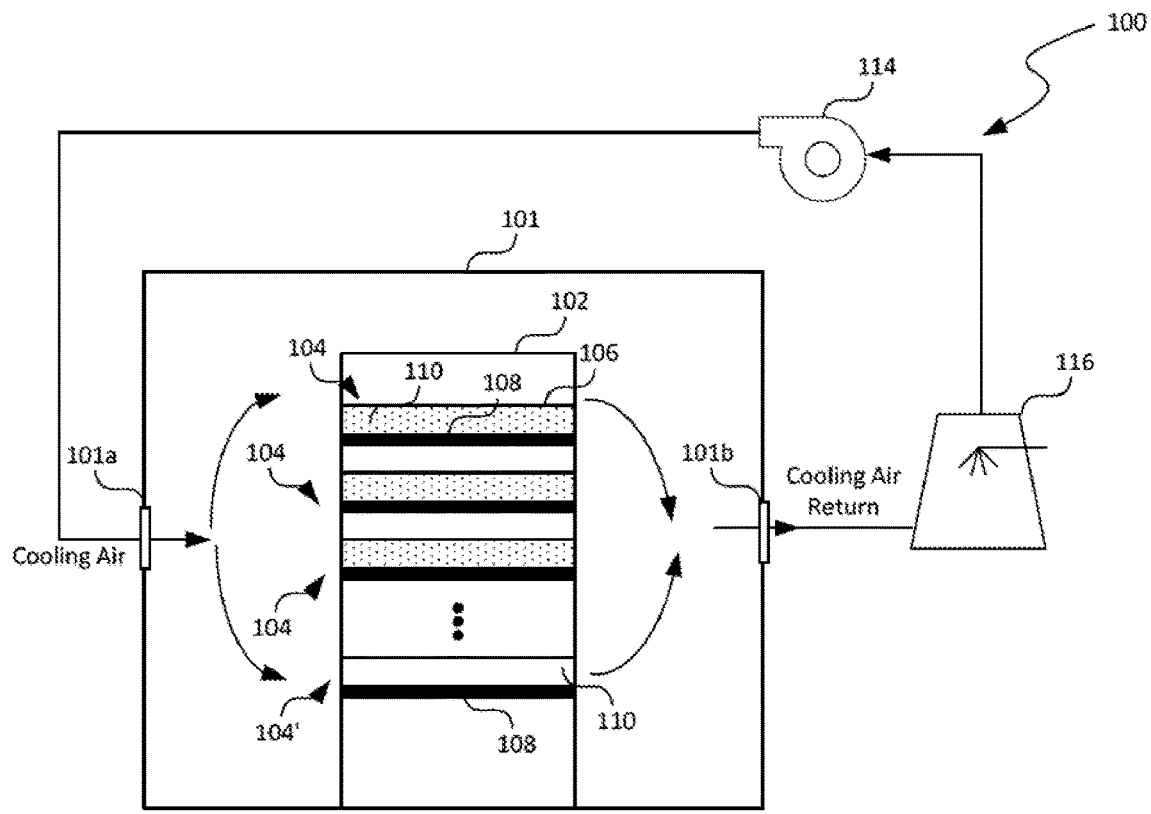
FIGS. 1 and 2 are schematic diagrams of a computing facility having self-contained server assemblies configured in accordance with embodiments of the disclosed technology.

Certain embodiments of computing facilities, systems, devices, components, modules, and processes for rack mountable self-contained server assemblies are described below. In the following description, specific details of components are included to provide a thorough understanding of certain embodiments of the disclosed technology. A person skilled in the relevant art can also understand that the disclosed technology may have additional embodiments or may be practiced without several of the details of the embodiments described below with reference to FIGS. 1-5.

As used herein, the term an "immersion server enclosure" generally refers to a housing configured to accommodate a server, a server blade, or other suitable types of computing device submerged in a dielectric coolant inside the housing during operation of the server. A "dielectric coolant" generally refers to a liquid that is thermally conductive but dielectric. Example dielectric coolants can include mineral-oils or synthetic chemicals. Such a dielectric coolant can have a dielectric constant that is generally similar to that of ambient air (e.g., within 100%). For example, a dielectric coolant provided by 3M (Electronic Liquid FC-3284) has a dielectric constant of 1.86 while that of ambient air at 25° C. is about 1.0. In certain implementations, a dielectric coolant can have a boiling point low enough to absorb heat from operating electronic components (e.g., CPUs, GPUs, etc.). For instance, Electronic Liquid FC-3284 provided by 3M has a boiling point of 50° C. at 1 atmosphere pressure.

Immersion cooling of servers can have many advantages when compared to air cooling. For example, immersion cooling can be more thermodynamically efficient due to higher heat transfer coefficients. However, current designs of tank-type enclosures may not be suitable for retrofitting existing datacenters or other suitable computing facilities. For example, one tank-type design includes an elongated container housing multiple server blades in the container. Retrofitting tank-type enclosures into support structures of an existing datacenter may be difficult and costly. In addition, such a tank-type design can incur high operating costs due to loss of a dielectric coolant used in the container due to leakage, pressure control, maintenance, or other reasons during operation.

Several embodiments of the disclosed technology can address at least some of the drawbacks of the tank-type design by implementing a server-level self-contained immersion cooling server assembly. In certain embodiments, an immersion cooling enclosure can include a condenser assembly, a dielectric coolant assembly pre-charged with a dielectric coolant, and an optional inert gas assembly containing an inert gas. As such, facilities that support immersion cooling can all be included in the immersion cooling enclosure to reduce costs of field erection and installation. In addition, pressure control, fluid expansion, and dielectric coolant condensing can all be server-level serviceable, and thus reducing large scale downtime, as described in more detail below with reference to FIGS. 1-5.

FIG. 1 is a schematic diagram of a computing facility 100 having one or more self-contained server assemblies 104 with immersion cooling enclosures 106 configured in accordance with embodiments of the disclosed technology. As shown in FIG. 1, the computing facility 100 can include a controlled environment 101 (e.g., a room) housing a support structure 102 in which multiple server assemblies 104 can be installed. The computing facility 100 can also include a circulation fan 114 and a cooling tower 116 operatively coupled to the server assemblies 104. Even though only one support structure 102 is shown in FIG. 1 for illustration purposes, in other embodiments, the computing facility 100 can include multiple support structures 102 (not shown), multiple groups of support structures 102, and/or other suitable components arranged in series, in parallel, or in other suitable configurations.

The support structure 102 can include any suitable types of structures in which the server assemblies 104 can be installed. In one example, the support structure 102 can include a rack, e.g., a 19-inch for mounting multiple servers provided by Dell Corporation of Austin, Texas. In another example, the support structure 102 can include a drawer, a shelf, a cabinet, or other suitable types of frame. Though not shown in FIG. 1, in certain implementations, the support structure 102 can also house a fan, one or more intercoolers, and/or other suitable mechanical/electrical components. In other implementations, the support structure 102 can also house a coolant supply assembly 115, as described in more detail below with reference to FIG. 2.

As shown in FIG. 1, the support structure 102 can be configured to support multiple server assemblies 104 with both immersion-cooled and air-cooled server assemblies. For example, server assemblies 104' can be configured as air cooled by including an enclosure with air inlets, multiple air passages, and air outlets (not shown) that allow the cooling air from the circulation fan 114 to flow past the various hardware components on the server blade 108. As such, heat produced by the hardware components may be removed by the cooling air before the cooling air is exhausted via the air outlet 101b.

One or more of the server assemblies 104 can also be configured as immersion-cooled by individually including a server or server blade 108 (shown as a black rectangle) submerged in a dielectric coolant 110 in an immersion cooling enclosure 106. Though not shown in FIG. 1, the immersion cooling enclosure 106 can include a condenser assembly 140, a dielectric coolant assembly 150, and an optional inert gas assembly 160 (shown in FIG. 4A) operatively coupled to the server blade 108 to facilitate immersion cooling of various hardware components on the server blade 108. Example configurations of the immersion cooling enclosure 106 are described in more detail below with reference to FIGS. 3-4B.

The circulation fan 114 can be configured to provide cooing air to the controlled environment 101 via an air inlet 101a. For example, the circulation fan 114 can be configured to force cooling air into the controlled environment 101, flow past the server assemblies 104 in the support structure 102 to carry away produced heat from the server assemblies 104, and exhaust the cooling air carrying the produced heat to the cooling tower 116 as cooling air return via an air outlet 101b. The circulation fan 114 can include a centrifugal, a piston, or other suitable types of fan or compressor. Though particular configuration for cooling air circulation and cooling is shown in FIG. 1, in other embodiments, the computing facility 100 can also include additional and/or different components. For example, the computing facility 100 can include a chiller, one or more heat exchangers (not shown), and/or other suitable mechanical components for removing heat from the cooling air return.

In operation, components of the server blades 108 in the individual server assemblies 104 can consume power from a power source (not shown, e.g., an electrical grid) to execute suitable instructions to provide desired computing services. The dielectric coolant 110 can absorb the heat produced by the components during operation and eject the absorb heat into the cooling air flowing past the server assemblies 104. In certain embodiments, the dielectric coolant 110 absorbs the heat produced by the servers via phase transition, i.e., evaporating a portion of the dielectric coolant into a vapor. The evaporated dielectric coolant 110 can then be cooled by the cooling air using an air-cooled condenser assembly 140 (shown in FIG. 4A) and condensed into a liquid form. The condensed dielectric coolant 110 can then be recirculated to the server blades 108 via gravity or other suitable means. In other embodiments, the dielectric coolant 110 can absorb the heat without a phase change. The circulation fan 114 then forwards the heated cooling air to the cooling tower 116 for discarding the heat to a heat sink (e.g., the atmosphere). The cooling air can then be circulated back to the server assemblies 104 by the circulation fan 114.

Figure 2:
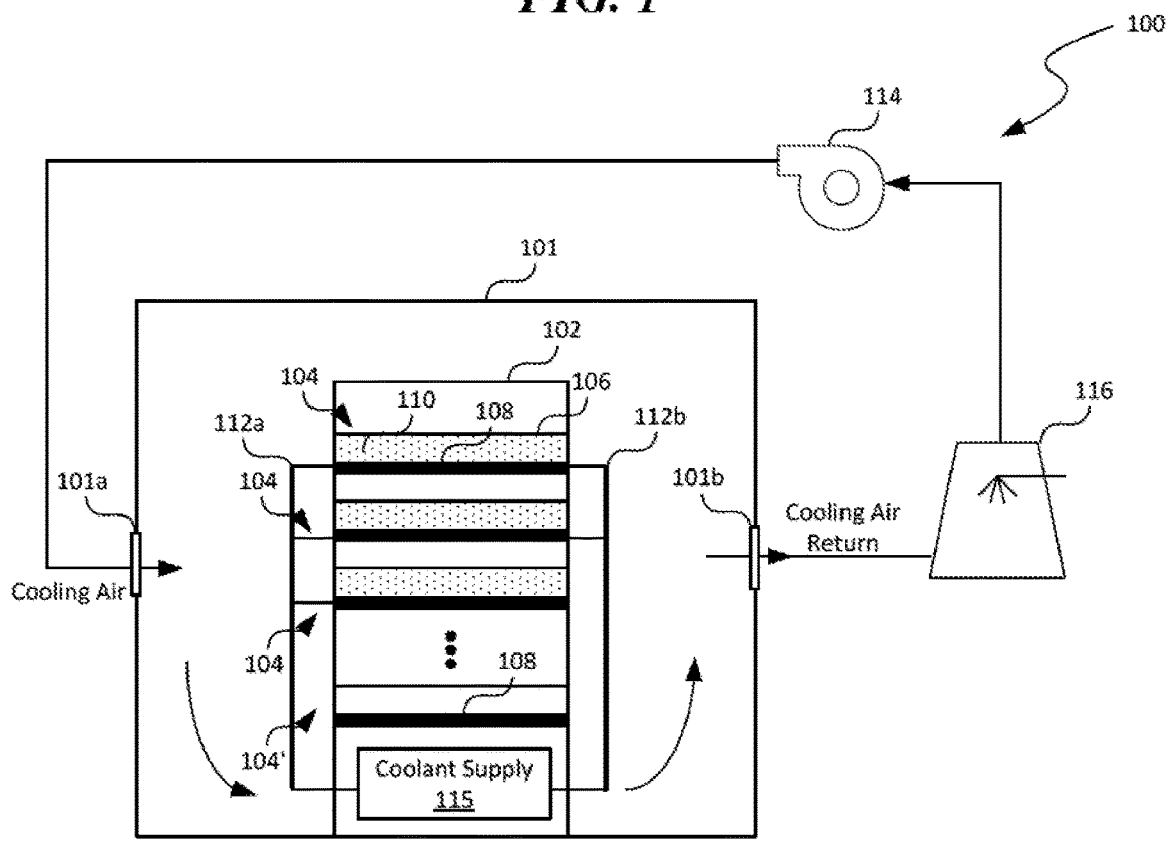

Though the self-contained server assembly 104 described above with reference to FIG. 1 includes an individual air-cooled condenser assembly 140, in other embodiments, the condenser assembly 140 can be configured to receive a coolant (e.g., cooling water) from a source external to the immersion cooling enclosure 106. For example, as shown in FIG. 2, the support structure 102 can house a coolant supply assembly 115 configured to provide a coolant such as cooling water to the immersion cooling enclosures 106 via a supply manifold 112a and a return manifold 112b. During operation, the coolant supply assembly 115 can be configured to provide the coolant to the condenser assembly 140 in the individual immersion cooling enclosures 106 via the supply manifold 112a to remove heat from the dielectric coolant 110. The cooling water with the removed heat can then be returned to the coolant supply assembly 115 via the return manifold 112b. The coolant supply assembly 115 can then be configured to eject the removed heat from the cooling water to the cooling air in the controlled environment 101 or to other suitable heat sinks. Example components of the coolant supply assembly 115 are described in more detail below with reference to FIGS. 4A and 4B.

Figure 3:
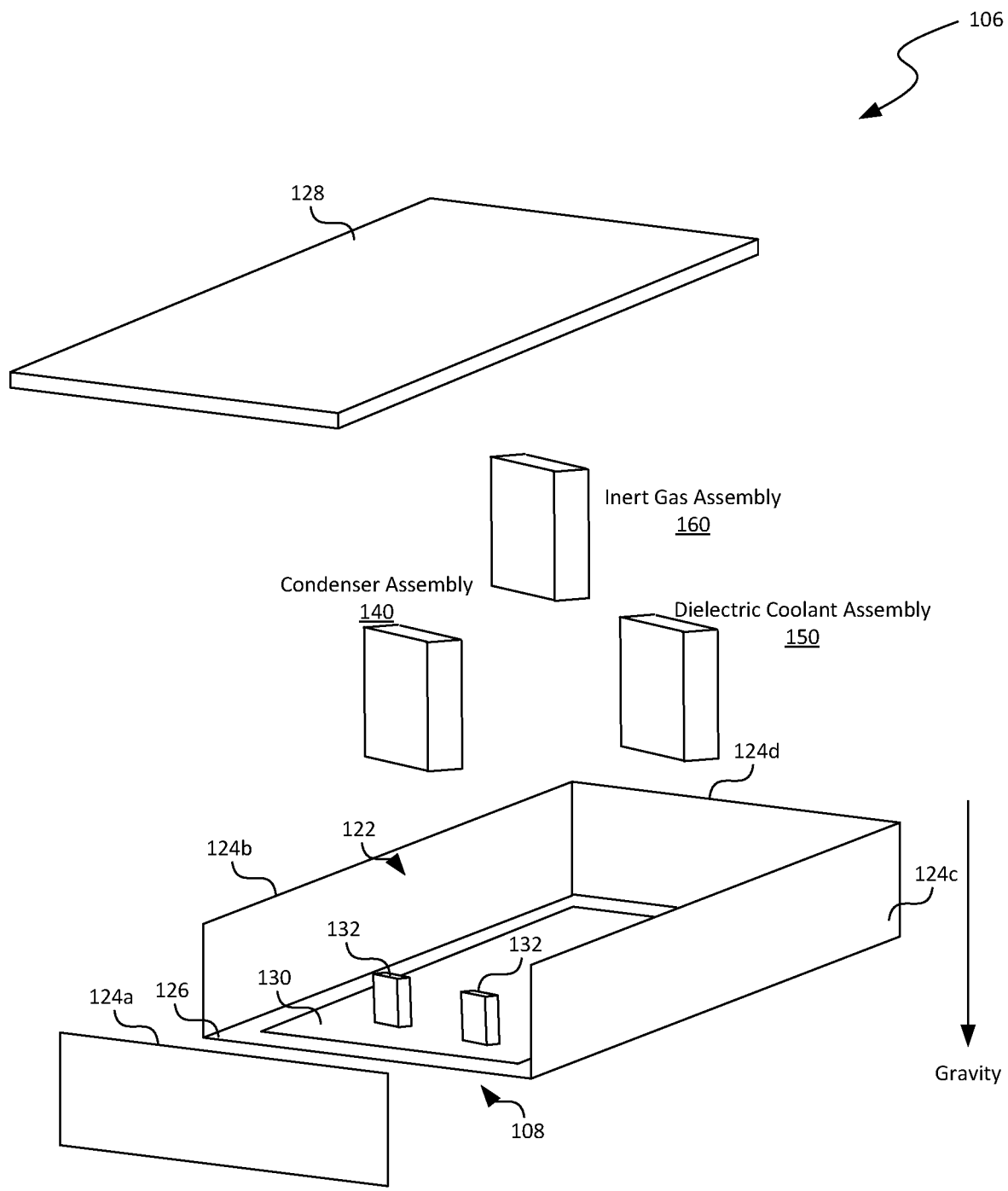
FIG. 3 is a schematic exploded perspective view of an example self-contained server assembly configured in accordance with embodiments of the disclosed technology.

FIG. 3 is an exploded perspective view of an example immersion cooling enclosure 106 suitable for the computing facility of FIG. 1 in accordance with embodiments of the disclosed technology. As shown in FIG. 3, the immersion cooling enclosure 106 can include a top wall 128, a bottom wall 126 opposite the top wall 128, and multiple sidewalls 124 (shown as first, second, third, and fourth sidewalls 124a-124d, respectively) between the top wall 128 and the bottom wall 126. As shown in FIG. 3, the top wall 128, the bottom wall 126, and the sidewalls 124 can form a housing having an interior space 122 in which a dielectric coolant 110 (shown in FIG. 1) can be contained. The bottom wall 130 can also be configured to mount a server blade 108 having a printed circuit board or PCB 130 carrying one or more heat producing components 132. As used herein, the term "heat producing components" can include any electronic components that produce heat during operation. Examples of heat producing components 132 can include CPUs, GPUs, SSDs, memory chips, etc.

As shown in FIG. 3, the immersion cooling enclosure 106 can also include a condenser assembly 140, a dielectric coolant assembly 150, and an optional inert gas assembly 160 housed in the interior space 122 of the immersion cooling enclosure 106. Each of the condenser assembly 140, dielectric coolant assembly 150, and optional inert gas assembly 160 can include a corresponding housing with suitable inlets, outlets, ports, or other suitable openings in fluid communication with the interior space 122. For example, the condenser assembly 140 can include a vapor inlet 141 and a liquid outlet 142 (shown in FIG. 4A). The dielectric coolant assembly 150 can include a coolant port 151 (shown in FIG. 4A). The inert gas assembly 160 can include a gas port 161 (shown in FIG. 4A). In other examples, the foregoing assemblies 140, 150, and 160 can include other suitable types of ports or components, as described in more detail below with reference to FIGS. 4A and 4B.

The condenser assembly 140 can be configured to remove heat from and condense a vapor of the dielectric coolant 110 in the interior space 122 into a liquid form. The condensed dielectric coolant can then be returned to submerge the heat producing component 132 on the PCB 130. The dielectric coolant assembly 150 can be configured to be pre-charged with a certain amount of the dielectric coolant 110. During installation, a portion of the pre-charged dielectric coolant can be released into the interior space 122 to submerge the heat producing components 132. During operation, the immersion cooling enclosure 106 can also include a level controller that is configured to adjust a liquid level of the dielectric coolant 110 in the interior space 122 by controllably releasing additional dielectric coolant 110 into the interior space 122. As such, a target liquid level in the immersion cooling enclosure 106 may be maintained. The inert gas assembly 160 can be configured to provide an inert gas (e.g., nitrogen or argon) into the interior space 122 as blanketing against loss of vaporized dielectric coolant 110. In certain embodiments, the immersion cooling enclosure 106 can also include a pressure controller that is configured to controllably release an amount of the inert gas from the inert gas assembly 160 to maintain a target pressure in the interior space 122. In further embodiments, the inert gas assembly 160 may be omitted in part or in whole. Example components of the condenser assembly 140, dielectric coolant assembly 150, and the inert gas assembly 160 are described in more detail below with reference to FIGS. 4A and 4B.

Figure 4A:
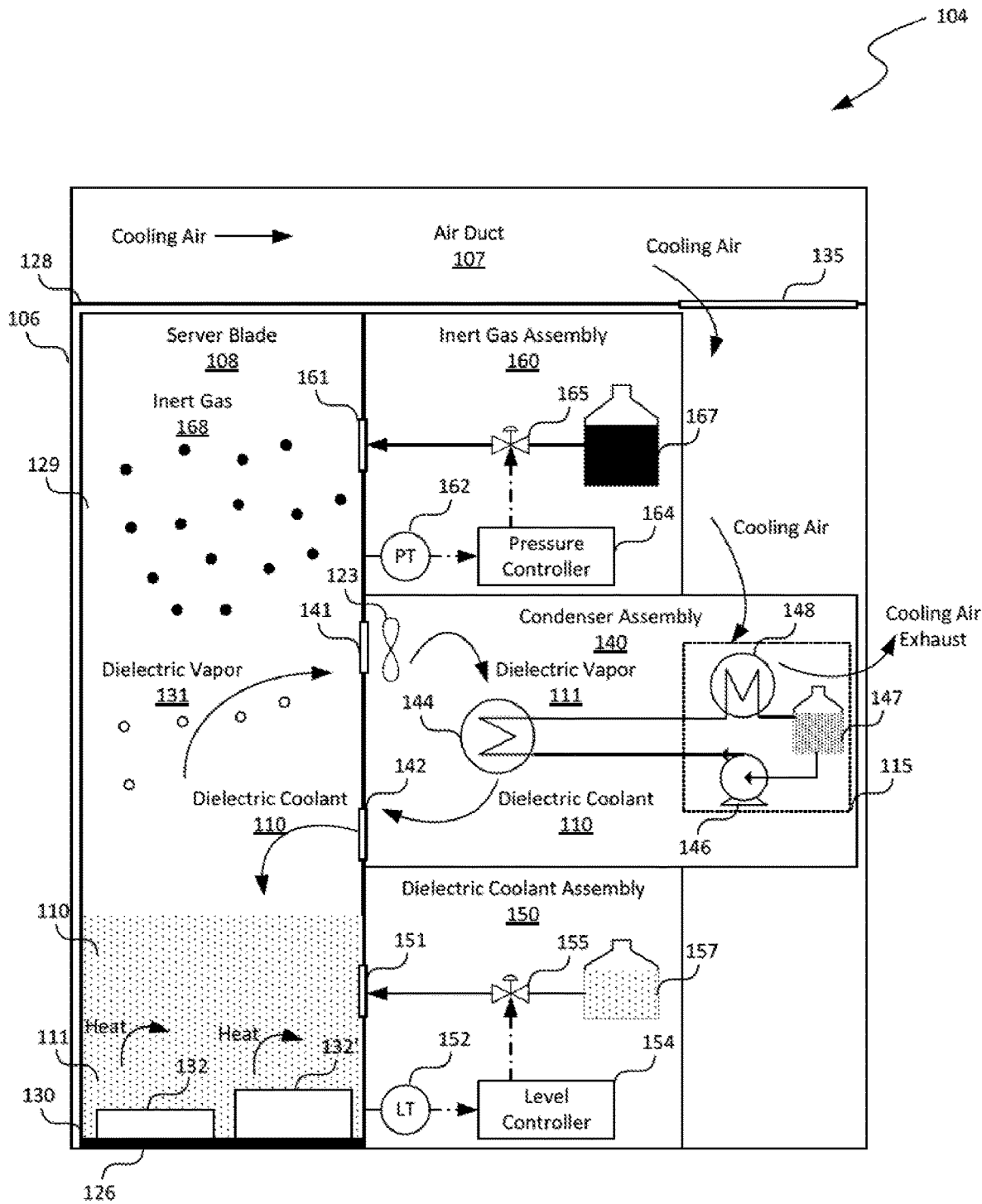
FIGS. 4A and 4B are schematic partial cross-sectional views of an example self-contained server assembly during certain stages of operation in accordance with additional embodiments of the disclosed technology.
Figure 4B:
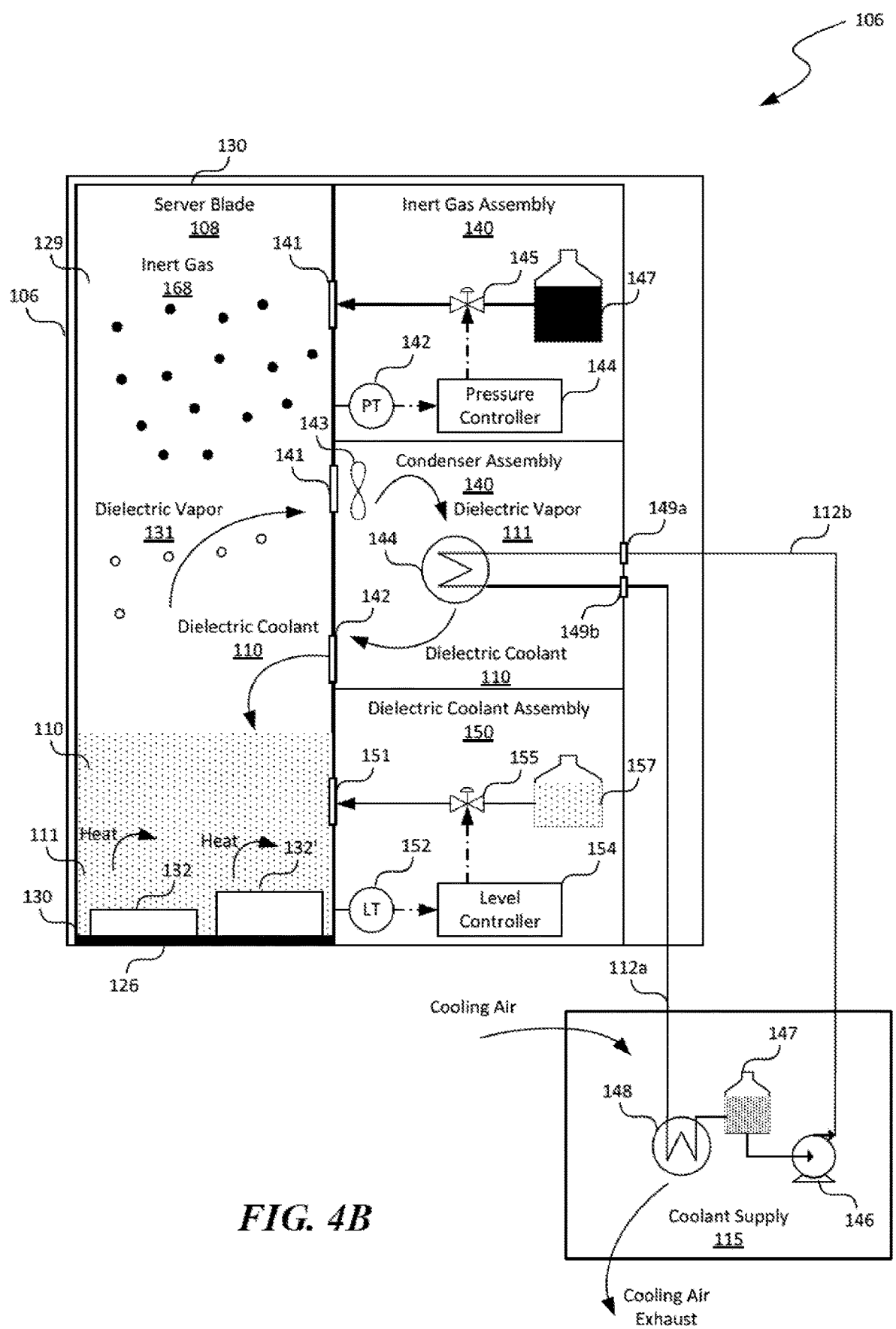

FIGS. 4A and 4B are schematic cross-sectional views of a self-contained server assembly 104 during certain stages of operation in accordance with additional embodiments of the disclosed technology. As shown in FIG. 4A, the printed circuit board 130 can be mounted directly to the bottom wall 126 of the immersion cooling enclosure 106 via adhesives, fasteners, pressure fitting, or other suitable mounting techniques. The heat producing components 132 can be carried on the printed circuit board 130 and can have different heights extending from the bottom wall 126 toward the top wall 128. For example, the heat producing component 132' can have a height h that is largest among all the heat producing components 132. In accordance with embodiments of the disclosed technology, the printed circuit board 130 can be oriented generally perpendicular (e.g., within) +/−10° to gravity when installed into the support structure 102. A distance between the top wall and the bottom wall (referred to as "spacing") can be just sufficient to accommodate the largest height h of the heat producing component carried on the printed circuit board 130. For example, the spacing can be about 105% of a largest height h extending from the bottom wall toward the top wall. In other examples, the spacing can be 110%, 115%, 120%, or other suitable values not exceeding 150%, 200%, or 250%. In FIGS. 4A and 4B, the spacing is exaggerated to illustrate various aspects of the disclosed technology.

Also shown in FIG. 4A, the server assembly 104 can have a vapor gap 129 above the dielectric coolant 110. In other implementations, the server assembly 104 may not have the vapor gap 129. Instead, the immersion cooling enclosure 106 can be substantially filled with the dielectric coolant 110 such that the dielectric coolant 110 is in contact with both the top wall 128 and the bottom wall 126. During operation, the heat producing components 132 can consume power to execute instructions to provide suitable computing services. The dielectric coolant 110 can absorb the produced heat by evaporating a portion of the dielectric coolant 110 into a dielectric vapor 131. As such, the dielectric coolant 110 becomes a two-phase fluid having a liquid phase 111 and a vapor phase, i.e., the dielectric vapor 131 (represented in FIG. 3A as bubbles). As shown in FIG. 4A, the dielectric vapor 131 can rise toward the vapor gap 129 and come in contact with the condenser assembly 140.

As shown in FIG. 4A, the condenser assembly 140 can include a vapor inlet 141 and a liquid outlet 142 at a first end proximate the server blade 108 and a coolant supply assembly 115 proximate to a second end opposite the first end. In the illustrated embodiment, the condenser assembly 140 can include an air mover 123 proximate the vapor inlet 141 and a condenser coil 144 that is configured to receive a coolant from the coolant supply assembly 115. The air mover 123 can include a fan or other suitable types of device configured to draw or otherwise induce the dielectric vapor 131 to enter the condenser assembly 140 via the vapor inlet 141. Upon contact with the condenser coil 144, heat can be removed from the dielectric vapor 131 to the coolant received from the coolant supply assembly 115. As such, the dielectric vapor 131 is condensed into a liquid form. The condensed dielectric coolant 110 can then be returned to the liquid phase 111 of the dielectric coolant 110 via the liquid outlet 142.

Also shown in FIG. 4A, the coolant supply assembly 115 can include a coolant pump 146, a coolant reservoir 147, and a heat exchanger 148 operatively coupled to one another. The coolant pump 146 can include a screw, piston, or other suitable types of pump configured to circulate the coolant from the coolant reservoir 147 to the condenser coil 144. The heat exchanger 148 can include a tube-in-shell, plate-and-frame, or other suitable types of heat exchanger configured to remove heat from the coolant returning from the condenser coil 144 to the cooling air. In the illustrated embodiment, the immersion cooling enclosure 106 can also include an air duct 107 above the top wall 128 and an air opening 135 on the top wall 128. The air opening 135 is configured to allow the cooling air received by the air duct 107 to be diverted or otherwise provided to be in contact with the heat exchanger 148 of the coolant supply assembly 115. In other embodiments, the air duct 107 may be omitted. Instead, the cooling air may be received via the air opening 135 as the cooling air flows between the server assemblies 104 in the support structure 102 (FIG. 1). In further embodiments, the cooing air may be provided to the heat exchanger 148 via an additional air mover (not shown) or via other suitable techniques.

As shown in FIG. 4A, the dielectric coolant assembly 150 can be in fluid communication with the interior space 122 hosting the server blade 108 via a coolant port 151. In the illustrated embodiment, the dielectric coolant assembly 150 includes a dielectric coolant reservoir 157 that is pre-charged dielectric coolant 110 and in fluid communication with the coolant port 151 via a control valve 155. The control valve 155 can include a diaphragm, ball, or other suitable types of valve with suitable actuators, limit switches, position switches, or other suitable components. During installation, upon installing the immersion cooling enclosure 106 into the support structure 102, the control valve 155 between the dielectric coolant reservoir 157 and the coolant port 151 can be actuated to allow a target amount of the pre-charged dielectric coolant 110 to be released onto the printed circuit board 130 to submerge various heat producing components 132. As such, complex operations to charge the dielectric coolant 110 during installation may be eliminated.

In certain embodiments, the immersion cooling enclosure 106 can also include a level sensor 152 (e.g., a float) operatively coupled to a level controller 154 that is configured to measure and control a liquid level of the dielectric coolant 110 on top of the printed circuit board 130. When the level sensor 154 detects a liquid level below a threshold, the level controller 154 may actuate the control valve 155 to introduce additional dielectric coolant 110 from the dielectric coolant reservoir 157 onto the printed circuit board 130. Thus, a target level of the dielectric coolant 110 may be maintained in the immersion cooling enclosure 106. In other embodiments, the level sensor 152 and/or the level controller 154 may be omitted, and the dielectric coolant 110 may be metered from the dielectric coolant reservoir 157 onto the printed circuit board 130 at a preset rate.

As shown in FIG. 4A, in additional embodiments, the immersion cooling enclosure 106 can further include an inert gas assembly 160 having a gas reservoir 167 that is configured to contain nitrogen, argon, or other suitable types of inert gas 168, a pressure control valve 165, a pressure sensor 162, and a pressure controller 164 configured to maintain a suitable pressure level in the vapor gap 129 inside the immersion cooling enclosure 106. The pressure control valve 165 can include a diaphragm, butterfly, or other suitable types of valve that interconnect the gas reservoir 167 to the vapor gap 129 via a gas port 161. The pressure sensor 162 can include a pressure transmitter configured to measure a pressure in the vapor gap 129. The pressure controller 164 can include a single-loop or other suitable types of pressure controller.

During operation, the pressure controller 164 can monitor a pressure level inside the immersion cooling enclosure 106 via the pressure sensor 162. When the pressure controller 164 detects a pressure level below a threshold, the pressure controller 164 can be configured to introduce additional inert gas 168 (represented as dark circles) from the gas reservoir 167 into the vapor gap 129 of immersion cooling enclosure 106 via the gas port 161. As such, the immersion cooling enclosure 106 can be pressurized with the inert gas 168 in order to reduce a rate of loss of the dielectric vapor 131. In further embodiments, the immersion cooling enclosure 106 can also include a membrane (not shown) around at least a portion of the internal space 122 of the immersion cooling enclosure 106. The membrane can be configured to allow air and/or the inert gas 168 to pass through but not the dielectric vapor 131, and thus facilitating reduction of loss of the dielectric coolant 110 from the immersion cooling enclosure 106.

FIG. 4B illustrates additional embodiments of the immersion cooling enclosure 106 in which a coolant supply assembly 115 is configured to provide a coolant such as cooling water to multiple immersion cooling enclosures 106 via a supply manifold 112a and a return manifold 112b. As shown in FIG. 4B, the condenser coil 144 can be coupled to the supply manifold 122a and the return manifold 122b via supply and return connectors 149a and 149b, respectively. In one embodiment, the condenser coil 144 can be coupled to the supply and return connectors 149a and 149b via compression fitting. In other embodiments, the condenser coil 144 can be coupled to the supply and return connectors 149a and 149b via friction fitting or other suitable fitting techniques.

During operation, the coolant supply assembly 115 can be configured to provide the coolant to the condenser assembly 140 in the individual immersion cooling enclosures 106 via the supply manifold 112a to remove heat from the dielectric coolant 110. The cooling water with the removed heat can then be returned to the coolant supply assembly 115 via the return manifold 112b. The coolant supply assembly 115 can then be configured to eject the removed heat from the cooling water to the cooling air in the controlled environment 101 or to other suitable heat sinks.

Figure 5:
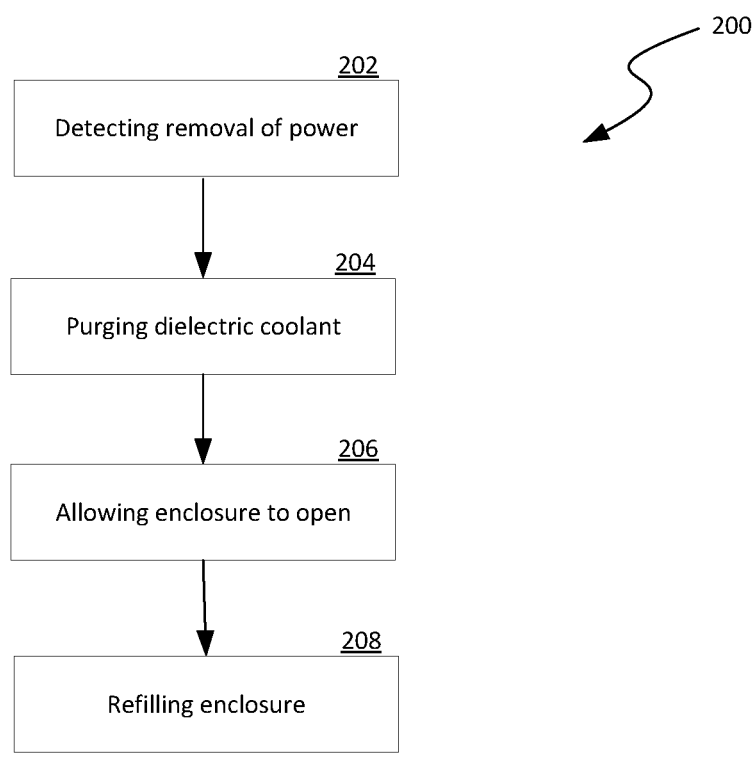
FIG. 5 is a flowchart illustrating a process of maintaining a server housed in a self-contained server assembly configured in accordance with embodiments of the disclosed technology.

FIG. 5 is a flowchart illustrating a process of maintaining a server housed in an example immersion cooling enclosure 106 configured in accordance with embodiments of the disclosed technology. As shown in FIG. 5, the process 200 can include detecting removal of power from the server housed in the immersion cooling enclosure 106 at stage 202. The process 200 can then include purging (e.g., with nitrogen) the dielectric coolant from the immersion cooling enclosure 106 at stage 204. In certain embodiments, purging the dielectric coolant can include actuating the pressure control valve 165 (FIG. 4A). In other embodiments, purging the dielectric coolant can include introducing an inert gas from an external source. Upon completion of purging the immersion cooing enclosure 106, the process 200 can include allowing an operator to open the immersion cooling enclosure 106 and perform various suitable operations, such as replacing components of the server. The process 200 can then include refilling the enclosure before power can be applied to the server at stage 208.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for maintaining a server housed in an immersion cooling enclosure and at least partially immersed in a coolant, comprising:
   detecting removal of power from the server housed in the immersion cooling enclosure then purging the coolant from the immersion cooling enclosure;
   allowing the immersion cooling enclosure to open; and
   refilling the immersion cooling enclosure.

2. The method of claim 1, wherein purging the coolant includes purging with nitrogen.

3. The method of claim 1, wherein purging the coolant includes actuating a pressure control valve.

4. The method of claim 1, wherein allowing the enclosure to open includes an operator opening the enclosure.

5. The method of claim 1, wherein allowing the enclosure to open includes automatically opening the enclosure.

6. The method of claim 1, further comprising performing physical operations on the server after the enclosure is opened.

7. The method of claim 1, further comprising applying power to the server.

8. The method of claim 1, further comprising refilling the enclosure before power can be applied to the server.

9. The method of claim 8, further comprising applying power to the server.

10. The method of claim 1, wherein allowing the immersion cooling enclosure to open includes opening suitably to perform maintenance operations.

11. The method of claim 10, wherein allowing the immersion cooling enclosure to open then replacing components of the server.

12. The method of claim 1, wherein detecting removal of power is detecting removal of all power from the server housed in the immersion cooling enclosure.

13. A method for maintaining a server housed in an immersion cooling enclosure and at least partially immersed in a coolant, comprising:

detecting removal of power from the server housed in the immersion cooling enclosure then purging the coolant from the immersion cooling enclosure by actuating a pressure control valve;

allowing the immersion cooling enclosure to open; and refilling the immersion cooling enclosure.

14. The method of claim 13, wherein purging the coolant includes purging with nitrogen.

15. The method of claim 13, wherein allowing the enclosure to open includes automatically opening the enclosure.

16. The method of claim 13, further comprising performing physical operations on the server after the enclosure is opened.

17. The method of claim 13, further comprising applying power to the server.

18. The method of claim 17, further comprising refilling the enclosure before power can be applied to the server.

19. A method for maintaining a server housed in an immersion cooling enclosure and at least partially immersed in a coolant, comprising:

detecting removal of power from the server housed in the immersion cooling enclosure then purging the coolant from the immersion cooling enclosure includes purging with nitrogen;

allowing the immersion cooling enclosure to open, wherein allowing the immersion cooling enclosure to open includes one or more an operator opening the enclosure or automatically opening the enclosure; and performing physical operations on the server after the enclosure is opened applying power to the server;

before power applying power to the server, refilling the immersion cooling enclosure.

20. The method of claim 19, wherein detecting removal of power is detecting removal of all power from the server housed in the immersion cooling enclosure.

* * * * *